United States Patent [19]
Fasullo et al.

[11] Patent Number: 5,691,891
[45] Date of Patent: Nov. 25, 1997

[54] CURRENT BALANCING ARRANGEMENT FOR PARALLELED DIODE ARRANGEMENTS

[75] Inventors: Greg H. Fasullo; Mark Elliott Jacobs, both of Dallas; Kenneth John Timm, Rockwall, all of Tex.

[73] Assignee: Lucent Technologies Inc., Murray Hill, N.J.

[21] Appl. No.: 643,216

[22] Filed: May 3, 1996

[51] Int. Cl.$^6$ ................................................. H02M 5/42
[52] U.S. Cl. .......................... 363/93; 323/251; 363/91
[58] Field of Search ............................ 323/334, 329, 323/251, 261; 363/90, 91, 130, 93

[56] References Cited

U.S. PATENT DOCUMENTS

| | | | |
|---|---|---|---|
| 2,778,987 | 1/1957 | Schmidt | 323/334 |
| 3,076,131 | 1/1963 | Weil | 363/95 |
| 3,417,239 | 12/1968 | Lunney | 323/258 |
| 3,422,341 | 1/1969 | Kurimura et al. | 363/41 |
| 5,132,889 | 7/1992 | Hitchcock et al. | 363/17 |

*Primary Examiner*—Peter S. Wong
*Assistant Examiner*—Shawn Riley

[57] ABSTRACT

A rectifier for a switching power supply or the like. The recitifier has a plurality of diodes coupled in parallel, each diode having in series therewith a saturable inductor and a node disposed between the diode and the inductor to form a diode/inductor pair. At least one resistor is connected between at least two of the nodes to assure nearly equal current flow in the diodes. Alternatively, a link winding on at least two of the inductors are coupled together to achieve current balancing.

15 Claims, 2 Drawing Sheets

CURRENT BALANCING ARRANGEMENT FOR PARALLELED DIODE ARRANGEMENTS

BACKGROUND OF THE INVENTION

1. Field of the Invention

This invention relates to power supplies in general and, more particularly, to high current switching power supplies.

2. Description of the Prior Art

High current DC power supplies typically have multiple rectifying diodes placed in parallel to share the current lead when the total desired output current of the power supply (lead current) exceeds that an individual diode can handle. Because of differing electrical characteristics between the diodes resulting from variations during the manufacture of the diodes, they cannot be merely paralleled and be expected to share the forward conduction current even somewhat evenly. Moreover, the diodes exhibit different reverse recovery times (due to, for example, different minority carrier lifetimes and charge storage levels in the diode, junction capacitances, etc.). When used in high frequency switching power supplies (e.g., switching at 20 kHz or higher), the different reverse recovery times may make one diode go out of conduction before the other, reducing the efficiency of the power supply and causing the diodes to dissipate different amounts of power.

To reduce the deleterious effects of diode reverse recovery time, diodes typically have in series a saturable inductor. Such inductors are characterized as having a core with a "rectangular" B-H loop. The inductor provides a given inductance until the core saturates, at which time the inductance is substantially decreased and remains so while the core is saturated. Once the core unsaturates, the inductor returns to its pre-saturation inductance value. Core saturation occurs when the current in the inductor (resulting from the integral over time of the voltage applied across the inductor, expressed as and referred to herein as volt-seconds) reaches a critical level, substantially determined by the core material, core geometry, and the number of turns on the core. Similarly, core un-saturation occurs when the current falls below another critical value, that value being less than the saturation current value.

It is believed that the inductor serves to reduce the effect of the stored charge in the diode by absorbing energy while the diode transitions from forward conduction to reverse bias conditions.

When multiple diodes are paralleled to handle large currents, the saturable inductors are added in series with each diode. If the difference in stored charge between each of the diodes is small, the inductors operate well enough for most applications. However, when the stored charge differences become substantial, particularly when the diodes are PN diodes having high reverse breakdown voltage (typically resulting in the diodes having large storage charges with a wide statistical variation), or there are significant differences between the characteristics of the inductors, the inductors cannot fully compensate and substantially unequal currents flow in the diodes due to the variability of the volt-seconds applied to the saturable inductors, resulting in one inductor saturating before the others. Moreover, it has been found that the amount of current flowing in one diode may vary with the overall current flow (load current) in the paralleled diodes, exhibiting "chaotic" behavior. Using, for example, three diodes and three corresponding series inductors, it has been observed that one diode will conduct on alternate cycles for a given load current and at a different load current the same diode conducts a small fraction of the current flowing in another diode.

Thus, it is desirable to provide a design for parallel diode arrangements that have consistent, substantially equal, current sharing (current balancing). Further, it is desirable that the design be tolerant of variations in inductor value and total (load) current flow.

SUMMARY OF THE INVENTION

This and other aspects of the invention may be obtained generally in a power supply having a rectifier, the rectifier having a plurality of diodes coupled in parallel, each diode having in series therewith a saturable inductor and a node disposed between the diode and the inductor to form a diode/inductor pair. The power supply is characterized by at least one resistor coupled between at least two of the nodes.

Alternatively, the aspects of the invention may also be obtained generally in a power supply having a rectifier, the rectifier having a plurality of diodes coupled in parallel, each diode having in series therewith a saturable inductor to form a diode/inductor pair. The power supply is characterized by a link winding on at least two of the inductors, the links being coupled together to form a link pair.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
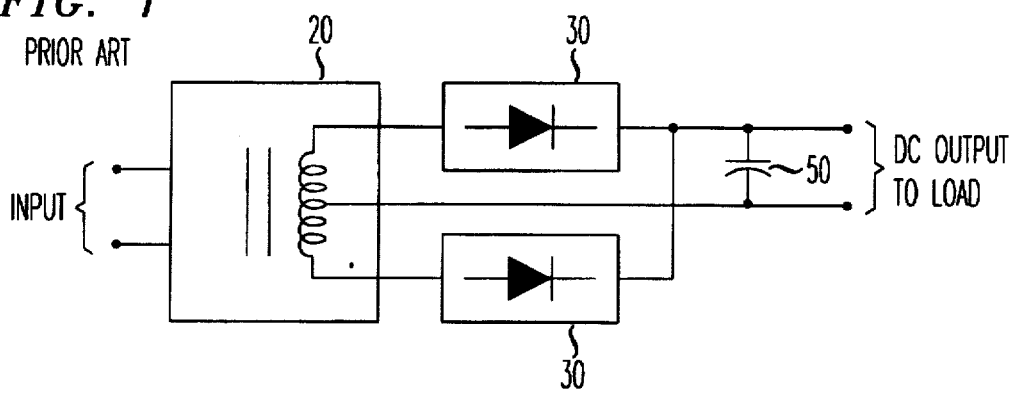
FIG. 1 is a simplified schematic diagram of a conventional power supply.
Figure 2:
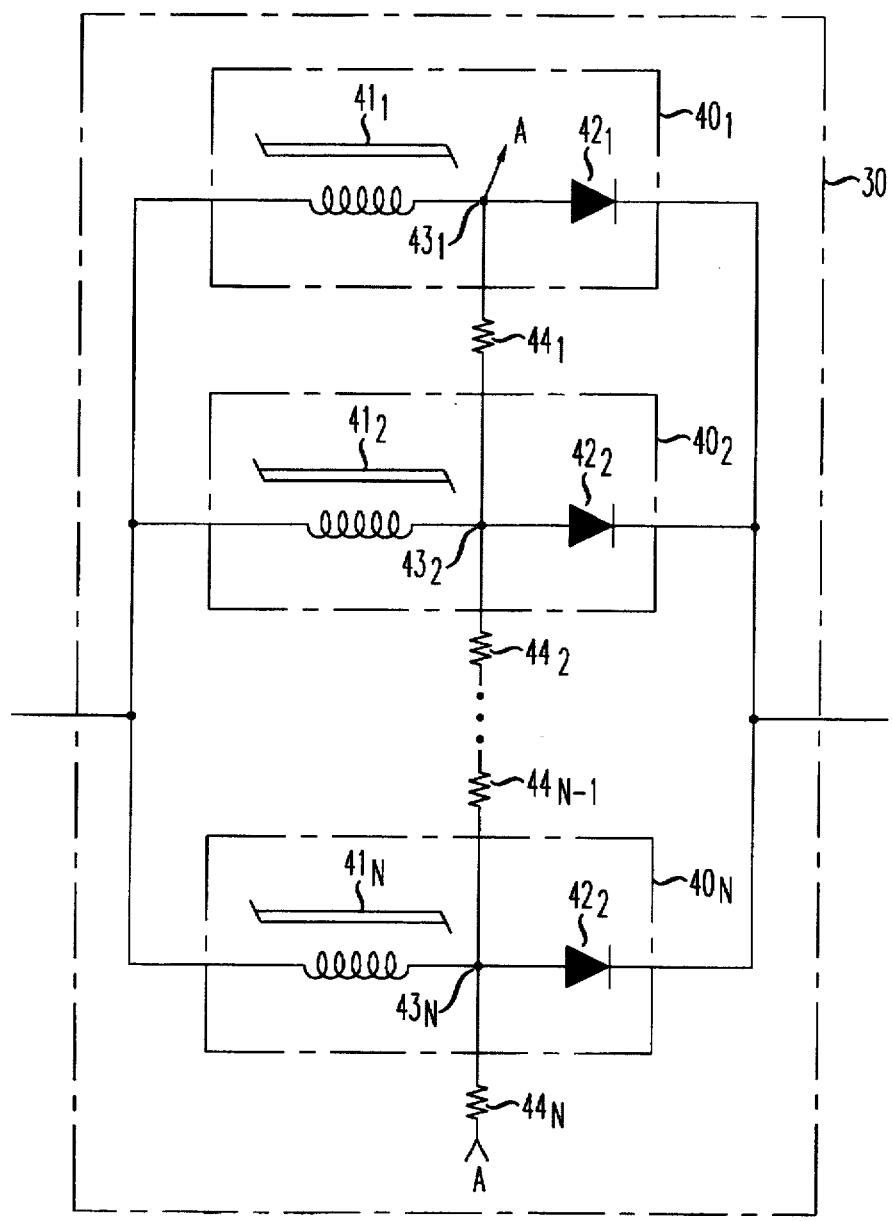
FIG. 2 is a simplified schematic diagram of a rectifier with multiple paralleled diodes in the power supply of FIG. 1 according to one exemplary embodiment of the invention.

Generally, the invention may be understood by referring to FIGS. 1 and 2. FIG. 1 depicts a simplified schematic of a conventional power supply, here a switching power supply 10, such as that disclosed in U.S. Pat. No. 5,303,138, assigned to the same assignee as this invention and included herein by reference. For purposes here, the power supply 10 takes energy from a power source connected to the input thereof and converts the energy into a regulated alternating signal at the output of circuitry 20. The details of the conversion process are not shown but are known to those skilled in the art and depicted in the above-identified U.S. Patent. Rectifiers 30, shown in an exemplary half-wave rectifying configuration, convert the alternating signal into a pulsating DC signal which is filtered by capacitor 50. Additional filtering, such as series inductors and additional filtering capacitors, may be added as necessary. The output of the power supply 10 provides a substantially DC current (load current) to a load (not shown).

As discussed below in more detail and in accordance with the exemplary embodiment of the invention shown in FIG. 2, the exemplary circuitry comprising the rectifiers 30 of FIG. 1 are shown having a plurality of diodes $42_1$–$42_N$ coupling in parallel, each diode having in series therewith a saturable inductor $41_1$–$41_N$ and a node $43_1$–$43_N$ disposed between the diode and the inductor to form a diode/inductor pair $40_1$–$40_N$. The power supply 10 (FIG. 1) is characterized by at least one resistor $44_1$–$44_N$ coupled between at least two of the nodes.

In more detail, the exemplary embodiment of the invention shown in FIG. 2 shows rectifier 30 with a plurality of paralleled diodes $42_1$–$42_N$ to provide a total current carrying capacity approximately equal to the sum of the current carrying capability (forward current) of the individual diodes $42_1$–$42_N$. As many diodes are paralleled as needed to handle the desired load current. As mentioned above, the addition of saturable inductors $41_1$–$41_N$ serves to reduce the effects of reverse recovery charge storage of the corresponding individual diodes and also helps equalize the division of forward current among the diodes because of the small, substantially equal, resistances of the windings in the inductors.

As discussed previously, the mere paralleling of the diode/inductor pairs $40_1$–$40_N$ can give unpredictable and chaotic results, such as current hogging by one or more of the diodes, current sharing that varies with load current, etc. It has been found that the addition of resistors $44_1$–$44_N$ suppresses the chaotic behavior of the paralleled diode/inductor pairs $40_1$–$40_N$, by, it is believed, equalizing the volt-seconds each inductor absorbs. The range of values for the resistors ranges from 1 to 200 ohms, the exact value found not to be critical. Moreover, not all the resistors are necessary or need to be of equal value. For example, at least one of the resistors can be removed without any deleterious effects. With these resistors in place, it has been found that the number of windings on the inductors $41_1$–$41_N$ can be different with out any deleterious effects noted in the operation of the rectifier 30.

Figure 3:
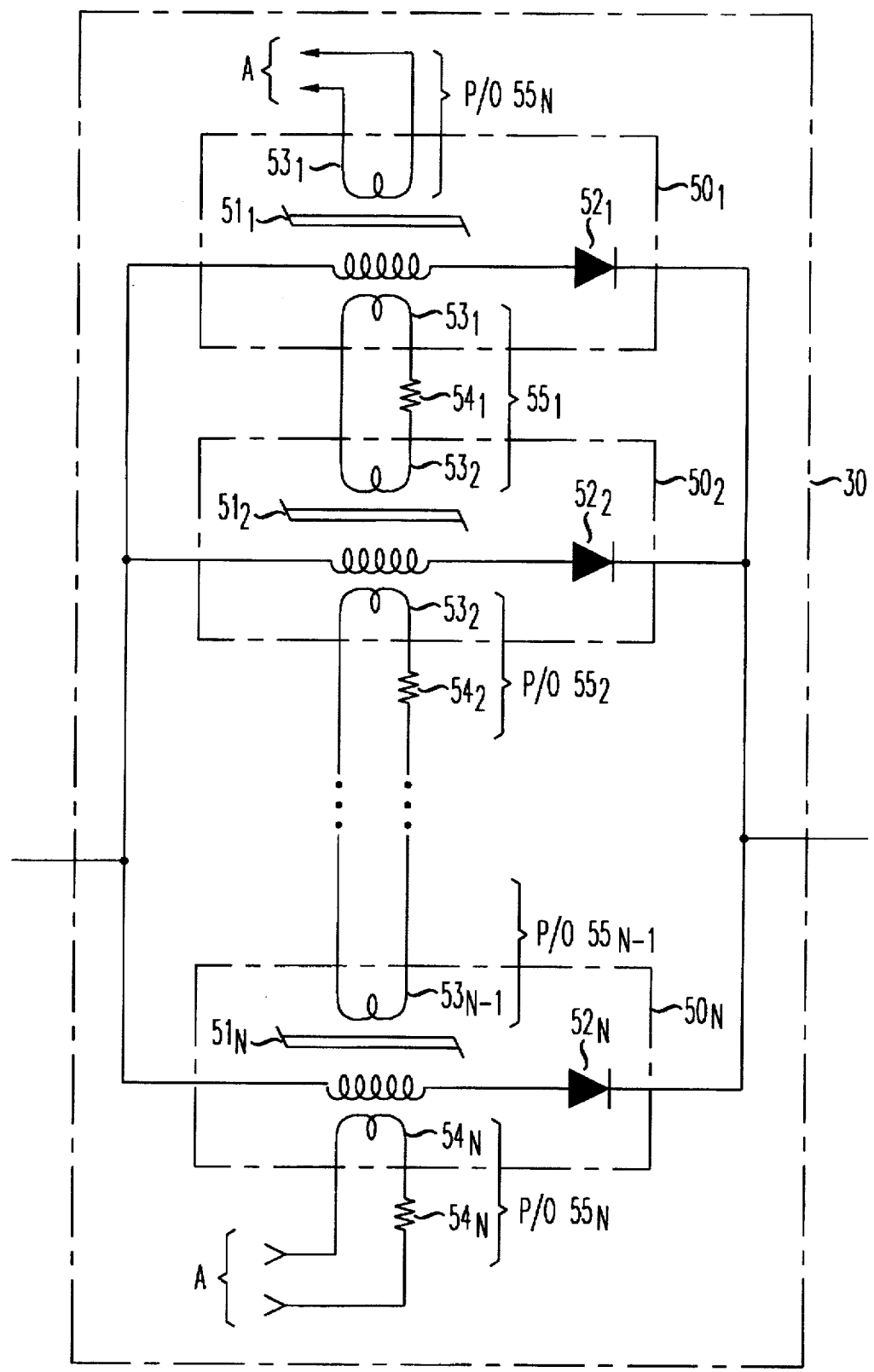
FIG. 3 is a simplified schematic diagram of an alternative exemplary embodiment of a rectifier in the power supply of FIG. 1.

An alternative, somewhat more complex, embodiment of the invention is shown in FIG. 3. The rectifier 30 has a plurality of diodes $52_1$–$52_N$ coupled in parallel, each diode having in series therewith a saturable inductor $51_1$–$51_N$ to form a diode/inductor pair $50_1$–$50_N$. At least two link windings, such as $53_1$ and $53_2$, are wound on at least two corresponding inductors. The links are coupled together to form a link pair $55_1$–$55_N$. Resistors $54_1$–$54_N$ may be added in series with each link pair. Exemplary values for the resistors range from 0 (no resistor) to 200 ohms, the exact value being not critical and the resistors may have unequal values. Less than N link pairs $55_1$–$55_N$ can also be used.

An extreme example of the above embodiments would have N+N(N−3)/2 resistors $44_x$ (FIG. 1) or link pairs $54_x$ (FIG. 2), representing every possible interconnection between the diode/inductor pairs. While possible, this is typically unnecessary.

EXEMPLARY RESULTS

A 65 kHz, 100 ampere, 54 volt, switching power supply as been fabricated similar to the design shown in FIG. 1 and utilizing three diodes in the rectifier arrangement 30 shown in FIG. 2. The diodes $42_1$–$42_3$ are Motorola MUR3020PT high current diodes and the corresponding saturable inductors $41_1$–$41_3$ have four turns each of doubled No. 14 gage wire on METGLAS MP1706 cores made by Allied Signal (METGLAS is a registered trademark of Allied Signal). Two one-ohm resistors $44_1$–$44_2$ are used in each rectifier. The measured results showed that substantially equal currents flowed in each diode regardless of load current. Moreover, even with a different number of windings (e.g., 3 instead of 4) on one or more of the inductors, the diodes continued to share substantially equal amounts of current without any observed chaotic behavior in current flow.

Having described the preferred and other embodiments of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. In a power supply, a rectifier having a plurality of diodes coupled in parallel, each diode having in series therewith a saturable inductor and a node disposed between the diode and the inductor to form a diode/inductor pair, comprising:

at least one resistor coupled between at least two of the nodes.

2. The power supply as recited in claim 1, wherein there are N diode/inductor pairs and N−1 or less resistors.

3. The power supply as recited in claim 2, wherein each resistor has a value between 1 and 200 ohms.

4. The power supply as recited in claim 3, wherein the power supply is a switching power supply.

5. The power supply as recited in claim 4, wherein the diodes are PN junction diodes.

6. The power supply as recited in claim 4, wherein the diodes are Schottky diodes.

7. The power supply as recited in claim 4, wherein if there are more than one resistor, each resistor has a substantially equal value.

8. In a power supply, a rectifier having a plurality of diodes coupled in parallel, each diode having in series therewith a saturable inductor to form a diode/inductor pair, comprising:

a link winding on at least two of the saturable inductors, the links being coupled together to form a link pair.

9. The power supply as recited in claim 8, further characterized by a resistor being disposed in series with the coupled link windings.

10. The power supply as recited in claim 9, wherein there are N diode/inductor pairs and N−1 or less coupled link winding pairs.

11. The power supply as recited in claim 10, wherein each resistor has a value of 200 ohms or less.

12. The power supply as recited in claim 11, wherein the power supply is a switching power supply.

13. The power supply as recited in claim 12, wherein the diodes are PN junction diodes.

14. The power supply as recited in claim 12, wherein the diodes are Schottky diodes.

15. The power supply as recited in claim 12, wherein each resistor has substantially equal value.

* * * * *